United States Patent [19]
Walls

[11] Patent Number: 5,061,607
[45] Date of Patent: Oct. 29, 1991

[54] COMPOSITION FOR PROTECTING THE SURFACE OF LITHOGRAPHIC PRINTING PLATES

[75] Inventor: John E. Walls, Fort Collins, Colo.

[73] Assignee: Eastman Kodak Company, Rochester, N.Y.

[21] Appl. No.: 479,917

[22] Filed: Feb. 13, 1990

[51] Int. Cl.[5] .............................................. G03F 7/00

[52] U.S. Cl. .................................. 430/309; 430/302; 430/331; 101/450.1; 101/451; 101/463.1; 101/465

[58] Field of Search ...................... 430/331, 309, 302; 101/450.1, 451, 463.1, 465

[56] References Cited

U.S. PATENT DOCUMENTS

| | | | |
|---|---|---|---|
| 4,033,919 | 7/1977 | Lawson | 260/29.6 |
| 4,162,920 | 7/1979 | Gillich | 106/14.5 |
| 4,213,887 | 7/1980 | Walls et al. | 260/29.6 |
| 4,246,843 | 1/1981 | Garrett | 101/451 |
| 4,266,481 | 5/1981 | Garrett et al. | 101/456 |
| 4,399,243 | 8/1983 | Dixit et al. | 524/55 |
| 4,400,481 | 8/1983 | Dixit et al. | 524/55 |
| 4,475,460 | 10/1984 | Matsumoto | 101/465 |
| 4,719,172 | 1/1988 | Matsumoto et al. | 430/309 |
| 4,762,772 | 8/1988 | Kobayashi et al. | 430/309 |
| 4,840,875 | 6/1989 | Kunichika et al. | 430/309 |

*Primary Examiner*—Charles L. Bowers, Jr.
*Assistant Examiner*—Janis L. Dote
*Attorney, Agent, or Firm*—Alfred P. Lorenzo

[57] ABSTRACT

A single-phase homogeneous composition for the protection of lithographic printing plate surfaces is provided which comprises an aqueous solution of (a) a hydrophilic film forming compound which is essentially cold-water soluble,
(b) a hydrophilizing agent
(c) a wet film forming agent,
(d) a nonionic surfactant,
(e) a greasing agent, and (f) one or more desensitizing salts.

35 Claims, No Drawings

COMPOSITION FOR PROTECTING THE SURFACE OF LITHOGRAPHIC PRINTING PLATES

BACKGROUND OF THE INVENTION

1. Field of the Invention

This present invention relates to an improved finisher composition for protecting the surface of lithographic printing plates. More particularly, the present invention relates to aqueous finishers suitable for preserving non-image hydrophilicity and image oleophilicity. More specifically, the invention provides a finisher composition that resists damage due to scratching, has fast roll up without blinding, even when stored at high temperatures and humidities, and permits effective corrections to the plate such as additions and deletions.

2. Description or Related Art

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image area retains the water and repels the ink while the image area repels the water and accepts the ink. The ink on the image area is then transferred to the surface of a material upon which the image is to be reproduced, such as paper, cardboard and the like. Commonly the ink is transferred to an intermediate material commonly called a blanket which in turn transfers the ink to the surface of the material upon which the image is to be reproduced.

The most common type of lithographic plate to which the present invention is directed has a light sensitive coating applied to an aluminum base support. The coating may respond to light by having the portion which is exposed become soluble so that it is removed in the developing process. Such a plate is referred to as positive acting. Conversely, when the portion of the coating which is exposed becomes hardened, the plate is referred to as negative acting. In both instances the image area remaining is ink receptive or oleophilic and the non-image area is water receptive or hydrophilic. The differentiation between image and non-image areas is made in the exposure process where a film is applied to the plate with a vacuum to insure good contact. The plate is then exposed to a light source, a portion of which is composed of UV radiation. In the instance where a positive plate is used, the area on the film that corresponds to the image on the plate is opaque so that no light will strike the plate whereas the area on the film that corresponds to the non-image area is clear and permits the transmission of light to the coating which then becomes more soluble and is removed through development. In the case of the negative plate the converse is true. The area on the film corresponding to the image area is clear while the non-image area is opaque. The coating under the clear area is hardened by the action of light while the area not struck by light is removed by development. The light hardened surface of a negative plate is therefore oleophilic and will accept ink while the non-image area which has had the coating removed through the action of the developer is desensitized and therefore hydrophilic.

The developed plate, whether negative or positive, is rinsed and treated with a finisher to preserve the plate's image/non-image differentiation until such time that the plate is placed on a printing press to produce copies. It is necessary for the image to remain oleophilic and for the non-image area to remain hydrophilic. The interval between the time a plate is prepared and is run on press may vary from several hours to several weeks. When a plate is being stored, the conditions of storage may range from hot to cold and from dry to humid. It is not uncommon for plates stored under such conditions to manifest a variety of maladies which render the plate difficult to impossible to use. Performance deficiencies are characterized as slow roll up or blinding in the image area and toning or scumming in the background. This is particularly true for plates stored under high temperature and/or high humidity conditions. Additionally, plates may be stored under lighted conditions which causes light hardening of the finisher components thereby resulting in slow roll up or, in severe cases, blinding of the image. With the advent of aqueous plate systems, problems associated with finishers have become more acute. This is particularly true of slow roll up and blinding. In order to provide plates that are developable with less aggressive developers, coatings had to be modified. These modifications generally increase the susceptibility to slow roll up and blinding. To a lesser degree, but still important, is the background problem of scumming. Background sensitivity to ink has occurred primarily through the dilution of finisher compositions to minimize slow roll up.

An additional obstacle to the successful use of a finisher composition is the scratching problem associated with finished plates. Even when great care is taken, the handling of processed plates can cause scuffing and/or scratching of the surface. When this occurs in the image area it is usually not a problem unless the scratch is severe. However, when the background is damaged the areas affected become ink receptive. In this event the plate requires correction by a chemical treatment or by honing. Often the plate must be discarded.

To minimize either blinding or scumming, it is conventional to treat a freshly developed plate after water rinsing with a plate finisher that normally contains a hydrophilic colloid, a surfactant, salts and water.

Gum arabic and synthetic gums have been used to finish lithographic printing plates. However, with these agents, gum blinding often occurs.

Improved finishers have been prepared and used which contain water, tapioca dextrin, an anionic surfactant, and as a humectant, glycerin. Sporadic blinding occurred despite the improvement; performance was not consistent. The tapioca dextrin required prolonged heating to dissolve it. Another improved finisher is described in U.S. Pat. No. 4,162,920, which finisher is additionally a preserver. This finisher uses tapioca dextrin as the hydrophilic colloid. Other ingredients are a mixture of anionic and nonionic surfactants, glycerin and a petroleum distillate to dissolve the nonaqueous surfactant. An emulsion is formed. Despite freedom from blinding, as it is an emulsion, the finisher settles upon standing and is not usable for machine processing.

U.S. Pat. No. 4,400,481 teaches the use of a natural gum such as gum arabic and a synthetic gum such as polyacrylamide. This composition provides a clean background upon printing but has increased viscosity due to the use of homopolymeric polyacrylamide and exhibits slow roll up on aqueous plates. Additionally, the background is easily damaged which causes ink to adhere to the affected areas.

U.S. Pat. No. 4,213,887 teaches the use of dextrin or polyvinyl pyrrolidone as the hydrophilic polymer in combination with a nonionic surfactant, a humectant and an inorganic salt. This composition provides moderate roll up but does not improve over the inherent hydrophilicity of the background nor provide quick roll up with aqueous plates.

U.S. Pat. No. 4,033,919 teaches the use of copolymers of acrylamide and carboxyl containing monomers as substitutes for gum arabic in desensitizing lithographic plates The compositions as described are effective in rendering a hydrophilic background but seriously affect the ink receptivity of the image area.

U.S. Pat. Nos. 4,246,843 and 4,266,481 teach the use of carboxylated polymers of polyacrylamide. These compositions are effective in providing a hydrophilic surface but offer no resistance to scratching or storage at high temperatures and/or humidities. Additionally, the image is prone to have slow roll up or even blinding.

SUMMARY OF THE INVENTION

The invention provides a single-phase, homogeneous composition for the protection of lithographic printing plate surfaces which comprises an aqueous solution of (a) a hydrophilic film forming compound which is substantially cold water soluble,
(b) a hydrophilizing agent,
(c) a wet film forming agent,
(d) a nonionic surfactant,
(e) a greasing agent, and
(f) one or more desensitizing salts.

It is, therefore, an object of the present invention to provide a finisher composition for protecting lithographic printing plate surfaces which is a homogeneous aqueous solution.

It is a further object of the present invention to provide a finisher composition for protecting lithographic printing plates surfaces which alleviates the hereinbefore mentioned problems.

These and other objects of the instant invention will be in part discussed and in part apparent upon consideration of the detailed description of the preferred embodiments.

DESCRIPTION OF THE PREFERRED EMBODIMENTS

In the production of a photographic element, a sheet substrate, preferably aluminum and the alloys thereof, especially those aluminum compositions suitable for the manufacture of lithographic printing plates such as Alcoa 3003, 1100, 1050 and CZ-17, which may or may not have been pretreated by standard graining and/or etching and/or anodizing techniques as are well known in the art, may be coated by spraying, dipping, rolling or other means with a composition suitable for use as a hydrophilizing layer for lithographic plates. Standard metal support pretreatments include graining with a thermochemical etch, mechanical abrasion and/or electrochemical etch, anodizing with sulfuric and/or phosphoric acids and other well known methods, which are all known to one skilled in the art. The hydrophilizing layer composition employed in the practice includes aqueous solutions of alkali silicate.

The substrate is then coated by well known means in the art with a photosensitive coating which comprises a negative working photosensitive compound, in the event of a negative plate, such as diazo condensate, bisazide, diazide, photomonomer or photopolymer, or a positive working photosensitive compound, in the event of a positive plate, such as naphthalene diazo oxide sulfo esters. The coating may contain addenda such as colorants, binder resins, stabilizers and other art recognized ingredients. The coated substrate is exposed to ultraviolet radiation through a photographic mask in a known manner. The exposed photographic element is then developed to remove the non-image areas with an appropriate developing composition. Positive developers are typically aqueous alkaline compositions whereas the negative developer may be one of two types. The more widely known negative developer is solvent based and is characterized by having strong organic solvents which are required to remove the unexposed coating. This type of developer is becoming more unfavorable due to environmental and toxicological concerns. The newer type of developer is termed aqueous and is characterized as having little or no high boiling organic solvent which is nontoxic and various salts and/or surfactants. The developed photographic element is then treated with finishing composition provided by this invention. The finisher employed is an aqueous based solution which has a pH in the range of about 2 to 8, more preferably from about 3 to 6.5 and most preferably from about 4 to 5.5.

The finishing composition contains a hydrophilic film forming agent which is substantially cold water soluble. The preferred film formers are dextrins. A suitable dextrin is characterized as being 98% soluble is water at a temperature of about 22° C. although for the purpose of preparing the dextrin to produce a finisher product it is common to heat the solution to facilitate quicker dissolution. It is the purpose of the dextrin to provide a continuous hydrophilic film over the entire plate surface which is effective in preserving the inherent hydrophilicity of the background and is readily released with the application of the fountain solution. The cold water solubility requirement is particularly important for the quick release of the finisher film from the image so that a fast roll up is realized without the incidence of blinding. Preferred hydrophilic film formers include but are not restricted to mono-, di- and oligosaccharides, a-D-anhydroglucose/amylopectins corn syrup derivatives and dextrins derived from the acid or alkaline hydrolysis of corn, potato, rice, tapioca or wheat starches. The preferred dextrin is obtained from the acid hydrolysis of waxy maize corn starch. The preferred hydrophilic film forming agent concentration ranges from about 0.5% to about 15%, more preferably from about 2% to about 10% and most preferably from about 4% to about 8%.

The solution also contains a hydrophilizing agent to render the surface background more hydrophilic than might otherwise be realized from the inherent background hydrophilicity. At the same time the hydrophilizing agent must not interfere with or otherwise alter the inherent oleophilicity of the image area. Preferred hydrophilizing agents include but are not restricted to polyacrylamide including carboxylated polyacrylamide; polyvinyl alcohol; polyvinyl alkyl ethers such as, polyvinyl methyl ether, polyvinyl ethyl ether, and the like; cellulose derivatives such as, methyl cellulose, hydroxypropyl cellulose and the like. The preferred hydrophilizing agent is carboxylated polyacrylamide. The range of molecular weight for the carboxylated polyacrylamide is from about 10,000 to about 2,000,000, more preferably from about 50,000 to about 1,000,000 and most preferably from about 100,000 to about 500,000. The preferred hydrophilizing agent concentration ranges from about 0.01% to about 15%, more preferably from about 0.1% to about 8% and most preferably from about 0.5% to about 2%.

The solution also contains a wet film forming agent which maintains the protective finishing film in a semi-dry plasticized state. It is also preferred that the wet film former is hygroscopic so that the protecting film contains a low level of moisture. Although the finished plate appears dry and feels dry to the touch, the protecting layer is pliable. This feature additionally facilitates the quick and easy removal of the protecting layer when wetted with the fountain solution. More importantly the wet film former permits the protecting layer to deform when scratched so that the barrier function of the film is preserved. A dry brittle film will fracture, thereby exposing the background to air which will aerially oxidize the surface, thus resulting in a defect that can accept ink. Such an occurrence requires that a correction be made to the plate or that a new plate be made. Preferred wet film formers include but are not restricted to polyhydric alcohols having at least two hydroxyl groups such as, ethylene glycol, propylene glycol, trimethylol propane, pentaerythritol, polyethylene glycol, polypropylene glycol, glycerol and sorbitol. Most preferred is polyethylene glycol. The preferred wet film former concentration ranges from about 0.01% to about 6%, more preferably from about 0.1% to 3% and most preferably from about 0.5% to about 1.5%. The preferred wet film former molecular weight ranges from about 110 to about 2000, more preferably from about 150 to about 1000 and most preferably from about 200 to about 400.

The solution also contains a nonionic surfactant. The nonionic surfactant imparts a lower surface tension for the uniform application of the protective layer so that streaks, patterns and other irregularities are not realized. The preferred surfactant must not detract from the ability of the other protective layer components to either hydrophilize the background or render the image oleophilic. It also facilitates the quick and efficient removal of the protective layer when wetted with the fountain solution. Further, it assists the wet film former in maintaining a plasticized film that resists the deleterious effects of scratching. A most important consideration in the selection of a suitable surfactant is the ability to effectively solublize the greasing agent so that no emulsion or phasing is realized but rather a clear homogeneous solution. Preferred nonionic surfactants include but are not restricted to alkylphenoxypolyoxyethylene ethanol such as, nonyl phenoxy polyoxyethlene ethanol, octyl phenoxy polyoxyethylene ethanol, decyl phenoxy polyoxyethylene ethanol or dodecyl phenoxy polyoxyethylene ethanol, C8 to C18 aliphatic alcohol ethoxylates and ethoxylates of sorbitan monolaurate, ethoxylates of sorbitan monostearate, ethoxylates of sorbitan monopalmitate or ethoxylates of sorbitan monooleate. Most preferred is the ethoxylate (12 moles) of tridecyl alcohol. The preferred nonionic surfactant concentration ranges from about 0.01% to about 4%, more preferably from about 0.05% to about 3% and most preferably from about 0.1% to about 2%. The preferred nonionic surfactant HLB (hydrophile-lipophile balance) ranges from about 10 to about 20 and most preferred from about 12 to about 18. In addition, any of the surfactants set forth in U.S. Pat. No. 4,213,887, issued July 22, 1980, incorporated herein by reference, may be employed.

The solution also contains a greasing agent. The greasing agent is a compound that preferentially adheres to the image area thereby preventing the adherence of more hydrophilic components which may cause slow roll up or blinding. By being more oleophilic, the greasing agent also permits faster roll ups. Preferred greasing agents include but are not restricted to cetyl lactate, myristal lactate, myristal myristate, ethoxylated sorbitan tristearate, ethoxylated sorbitan trioleate, ethoxylates of sorbitan tetra-, penta- or hexaoleate and glycerol monostearate. Most preferred is the ethoxylate of sorbitan trioleate. The greasing agent concentration ranges from about 0.01% to about 1% and most preferably from about 0.05% to about 0.5%. The preferred HLB range is from about 8 to about 10.

The solution also contains one or more desensitizing salts. The salt(s) assists in the retention of hydrophilicity in the background and facilitates the release of the protective layer when wetted with the fountain solution on the printing press. Preferred desensitizing salts include but are not restricted to mono- or dibasic sodium, potassium, lithium or ammonium salts of phosphoric acid, and ammonium, sodium, potassium, lithium or magnesium salts of acetic, citric, nitric, tartaric and sulfuric acids. Most preferred salts are magnesium nitrate and ammonium dihydrogen phosphate. The preferred desensitizing salt concentration ranges from about 0.05% to about 8%, more preferably from about 0.1% to about 6% and most preferably from about 1% to about 4%.

The invention is further illustrated by the following examples in which parts are by weight unless otherwise specified.

In the examples several tests are employed to measure the ability of the protecting composition to preserve the background hydrophilicity and the image oleophilicity under severe storage conditions.

Test I: This test involves running a properly exposed, developed and finished plate on press after it is prepared by rolling up the plate solid with ink without the benefit of wetting the plate with the fountain solution. When the plate is solidly inked it is allowed to remain as such for 30 minutes, at which time the fountain solution is applied and the number of revolutions are noted as to how many sheets are required until a clean background and fully inked image are realized.

Test II: This test involves storing a properly exposed, developed and finished plate at 90° F. and 90% relative humidity for 48 hours. After being stored at these conditions, the plate is run on press wherein the plate is wetted with the fountain solution followed by the application of ink. This is characteristic of proper printing technique. The number of revolutions are noted as to how many sheets are required until a clean background and fully inked image are realized.

Test III: This test involves storing a properly exposed, developed and finished plate at 120° F. and 20% relative humidity for 48 hours. After being stored at these conditions the plate is run on press wherein the plate is wetted with the fountain solution followed by the application of ink. The number of revolutions are noted as to how many sheets are required until a clean background and fully inked image are realized.

EXAMPLE 1

A finisher is prepared according to the following formulation image to provide acceptable copies using the the procedures hereinbefore described for Tests I, II and III.

TABLE I

| | Ex. 2 | Ex. 3 | Ex. 4 | Ex. 5 | Ex. 6 | Ex. 7 |
|---|---|---|---|---|---|---|
| Ingredients | | | | | | |
| waxy maize dextrin | — | 4.5 | 4.5 | 4.5 | 4.5 | 4.5 |
| hydroxy propyl cellulose | 0.6 | — | 0.6 | 0.6 | 0.6 | 0.6 |
| polyethylene glycol | 1.2 | 1.2 | — | 1.2 | 1.2 | 1.2 |
| potassium dihydrogen phosphate | 2.0 | 2.0 | 2.0 | — | 2.0 | 2.0 |
| octylphenoxy polyethoxylate | 1.3 | 1.3 | 1.3 | 1.3 | — | 1.3 |
| myristal myristate | 0.1 | 0.1 | 0.1 | 0.1 | 0.1 | — |
| water (demineralized) | 94.8 | 90.9 | 91.5 | 92.3 | 91.6 | 90.4 |
| | 100.0 | 100.0 | 100.0 | 100.0 | 100.0 | 100.0 |
| Number of Sheets to Acceptable Print | | | | | | |
| Test I | | | | | | |
| Background | >20 | >20 | 10 | 15 | 18 | 8 |
| Image | 15 | 14 | >20 | 13 | 18 | >20 |
| Test II | | | | | | |
| Background | >20 | >20 | 12 | >20 | >20 | 10 |
| Image | 18 | 17 | >20 | 16 | >20 | >20 |
| Test III | | | | | | |
| Background | >20 | >20 | 11 | 18 | 19 | 8 |
| Image | 15 | 14 | >20 | 14 | >20 | >20 |

| Ingredient | Percent |
|---|---|
| waxy maize dextrin* | 4.5 |
| hydroxy propyl cellulose | 0.6 |
| polyethylene glycol** | 1.2 |
| potassium dihydrogen phosphate | 2.0 |
| octylphenoxy polyoxyethylene ethanol*** | 1.3 |
| myristal myristate | 0.1 |
| water | 90.3 |
| | 100.0 |

*the waxy maize dextrin is Stadex 201 manufactured and sold by A.E. Staley Mfg. Co., Decatur Ill.

**the polyethylene glycol is Carbowax 400 manufactured and sold by Union Carbide, Industrial Chemicals Div., Danbury, Ct.

***the octylphenoxy polyoxyethylene ethanol is Triton X-405 manufactured by Rohm and Haas, Philadelphia, Pa.

A 12"×24" negative working plate identified as SP2992, produced by the Eastman Kodak Company, Windsor, Colo., is properly exposed with a negative mask. This plate is characterized as an aqueous processable plate which is mechanically grained, anodized in phosphoric acid and coated with a light sensitive compound in accordance with the teaching of U.S. Pat. No. 3,929,489. The plate is properly developed with an aqueous developer identified as MX-1469/1, also produced and sold by Eastman Kodak Company. The plate is then finished with the composition of this example by spreading 20 ml. over the surface and buffing the surface until the plate is dry. Using Test I, the plate is found to have a clean background after 7 impressions and a fully inked image after 14 impressions. Using Test II, the plate is found to have a clean background after 10 impressions and a fully inked image after 18 impressions. Using Test III, the plate is found to have a clean background after 8 impressions and a fully inked image after 15 impressions. The acceptable range of impressions until an acceptable sheet is obtained with regard to both image and background is 20. Using this criteria it is noted that the finisher composition tested using all three test procedures was acceptable.

EXAMPLES 2 THROUGH 7

These examples demonstrate the disadvantageous results stemming from variations made in the inventive product wherein one ingredient is excluded from the formulation given in Example 1. Table I sets forth the formulation for each of these examples and details the number of sheets required for the background and

EXAMPLE 2

The waxy maize dextrin is excluded from the formulation. In like manner as described in Example 1, a plate is prepared, developed, finished with the composition of this example and tested. It is observed that the image gives acceptable roll up but the background is scummed under all three test conditions. The plate made according to Test I does become acceptably clean after 70 impressions but those plates made according to Tests II and III still print scummed after 300 impressions.

EXAMPLE 3

The hydroxy propyl cellulose is excluded from the formulation. In like manner as described in Example 1, a plate is prepared, developed, finished with the composition of this example and tested. It is observed that the image gives acceptable roll up but the background is scummed under all three conditions. The plates made according to Tests I and III become acceptably clean after 80 and 95 impressions, respectively. The plate prepared according to Test II requires 160 impressions before printing acceptably clean copies.

EXAMPLE 4

The polyethylene glycol is excluded from the formulation. In like manner as described in Example 1, a plate is prepared, developed, finished with the composition of this example and tested. It is observed that the background gives acceptable roll up but the image is blinded in all three instances. The plate prepared according to Test I becomes fully inked after 45 impressions, the plate prepared according to Test III becomes fully inked after 120 impressions while the plate prepared according to Test II is still blind after 300 impressions. It is also observed that all three plates have background defects which print due to scratching during handling.

EXAMPLE 5

The potassium dihydrogen phosphate is excluded from the formulation. In like manner as described in Example 1, a plate is prepared, developed, finished with the composition of this example and tested. It is observed that the plates prepared according to Tests I and III give acceptable quality in the background and image within the specified range. The plate prepared according to Test II inks up acceptably but requires 55 impressions before a clean background is realized. Although the printed sheet has acceptable cleanliness, the blanket on the press is observed to have a heavy build up of ink which is known as blanket toning. Such an event is undesirable in that the plate background is not fully repelling ink and may require special cleaning during the printing operation by shutting down the press and washing the plate and blanket. It is preferable to avoid this operation.

EXAMPLE 6

The octylphenoxy polyoxyethylene ethanol is excluded from the formulation. In like manner as described in Example 1, a plate is prepared, developed, finished with the composition of this example and tested. It is observed that the plate prepared according to Test I provides acceptable print quality in the background and image within the specified range. The plate prepared according to Test II does not have a clean background until 135 impressions nor a fully inked image until 240 impressions. The plate prepared according to Test III is acceptably clean in the background but requires 180 impressions before a fully inked image is realized.

EXAMPLE 7

The myristal myristate is excluded from the formulation. In like manner as described in Example 1, a plate is prepared, developed, finished with the composition of this example and tested. In all instances the background is observed to roll up acceptably clean. However the image is observed to be slow in accepting ink in all three instances. The plate prepared according to Test I is fully inked at 35 impressions. The plate prepared according to Test II is fully inked at 210 impressions while the plate prepared according to Test III is fully inked at 115 impressions.

EXAMPLES 8 THROUGH 16

The following nine examples demonstrate the results stemming from variations made in the inventive product. The ingredients are interchanged within the teachings of the instant invention as set forth in Table II. Although there were slight differences among the three tests used, all results are favorable and would be considered to be that expected from a preferred finisher. The results of Examples 8 through 16 show the interchangeability of components and the latitude of the formulation.

TABLE II

| | Ex. 8 | Ex. 9 | Ex. 10 | Ex. 11 | Ex. 12 | Ex. 13 | Ex. 14 | Ex. 15 | Ex. 16 |
|---|---|---|---|---|---|---|---|---|---|
| Ingredient | | | | | | | | | |
| waxy maize dextrin[1] | — | — | 4.0 | 6.0 | 4.7 | 6.0 | 8.0 | — | — |
| tapioca dextrin[2] | 5.5 | 8.0 | — | — | 4.7 | — | — | 6.0 | 4.5 |
| carboxylated poly-acrylamide[3] | — | 1.5 | — | 2.0 | — | 0.8 | — | 0.6 | — |
| hydroxy propyl cellulose | 0.6 | — | 1.9 | — | 0.7 | — | 1.0 | — | 0.6 |
| polyethylene glycol[4] | — | 1.5 | — | — | 0.5 | 1.0 | — | 1.2 | 1.5 |
| glycerin | 2.0 | — | 1.5 | 0.7 | — | — | 0.5 | — | — |
| magnesium nitrate | — | — | — | 1.0 | — | 1.5 | 2.0 | — | 0.3 |
| magnesium sulfate | — | 2.0 | 1.5 | — | 1.2 | — | — | — | — |
| sodium dihydrogen-phosphate | — | 0.3 | — | 1.5 | — | — | — | — | — |
| potassium acetate | 2.1 | — | 0.5 | — | 1.0 | — | — | — | — |
| potassium dihydrogen phosphate | — | — | — | — | — | 2.5 | 2.0 | 1.0 | — |
| nonylphenoxy polyethoxylate[5] | — | 1.1 | — | 1.0 | 0.8 | — | 1.0 | — | 0.8 |
| polyethoxylate tridecyl ether[6] | 0.5 | — | 0.8 | — | — | 1.0 | — | 0.8 | — |
| sorbitan trioleate ethoxylate[7] | — | — | 0.1 | 0.2 | — | 0.1 | 0.2 | — | 0.1 |
| calcium lactate | 0.1 | 0.2 | — | — | 0.1 | — | — | 0.1 | — |
| water (demineralized) | 89.2 | 85.4 | 89.7 | 87.6 | 91.0 | 87.1 | 85.3 | 90.3 | 92.2 |
| | 100.0 | 100.0 | 100.0 | 100.0 | 100.0 | 100.0 | 100.0 | 100.0 | 100.0 |
| Number of Sheets to Acceptable Print | | | | | | | | | |
| Test I | | | | | | | | | |
| Background | 5 | 5 | 6 | 5 | 7 | 3 | 4 | 5 | 6 |
| Image | 8 | 10 | 7 | 9 | 10 | 4 | 8 | 7 | 11 |
| Test II | | | | | | | | | |
| Background | 5 | 7 | 7 | 8 | 8 | 3 | 5 | 8 | 9 |
| Image | 9 | 9 | 10 | 12 | 15 | 5 | 10 | 11 | 16 |
| Test III | | | | | | | | | |
| Background | 8 | 5 | 6 | 8 | 7 | 3 | 4 | 7 | 6 |
| Image | 10 | 11 | 10 | 11 | 14 | 4 | 9 | 10 | 12 |

[1]Stadex 230 manufactured and sold by the A. E. Staley Company, Decatur, Ill.
[2]955 SR manufactured and sold by the A. E. Staley Company, Decatur, Ill.
[3]Cyanamer P-21 manufactured and sold by American Cyanamid, Wayne, NJ.
[4]Carbowax 200 manufactured and sold by Union Carbide, Danbury, CT.
[5]Ahcowet DQ-145 manufactured and sold by ICI Americas, Wilmington, DE.
[6]Trycol 6968 manufactured and sold by Quantum Chemical Corp., Cinncinnati, OH.
[7]Tween 85 manufactured and sold by ICI Americas, Wilmington, DE.

What is claimed is:

1. A single phase, homogeneous finisher composition for the protection of lithographic printing plate surfaces; comprising an aqueous solution of:

(a) a cold water soluble hydrophilic film forming compound selected from the group consisting of oligosaccharides, α-D-anhydroglucose/amylopectins, corn syrup derivatives and dextrins, (b) a hydrophilizing agent selected from the group consisting of polyacrylamides, polyvinyl alcohols, polyvinylalkyl ethers and cellulose derivatives, (c) a wet film forming agent selected from the group consisting of polyhydric alcohols, (d) a nonionic surfactant selected from the group consisting of alkylphenoxypolyoxyethylene ethanols, ethoxylates of C8 to C18 aliphatic alcohols, ethoxylates of sorbitan monolaurate, ethoxylates of sorbitan monostearate, ethoxylates of sorbitan monopalmitate and ethoxylates of sorbitan monooleate, (e) a greasing agent selected from the group consisting of cetyl lactate, myristal lactate, myristal myristate, ethoxylated sorbitan tristearate, ethoxylated sorbitan trioleate, ethoxylated sorbitan tetraoleate, ethoxylated sorbitan pentaoleate, ethoxylated sorbitan hexaoleate and glycerol monostearate, and (f) at least one desensitizing salt selected from the group consisting of mono and dibasic sodium, potassium, lithium and ammonium salts of phosphoric acid and ammonium, sodium, potassium, lithium and magnesium salts of acetic, citric, nitric tartaric and sulfuric acids.

2. The finisher composition of claim 1 wherein the cold water soluble hydrophilic film forming compound is used in the amount from about 0.5 to about 15 percent by weight.

3. The finisher composition of claim 1 wherein the cold water soluble hydrophilic film forming compound is used in the amount from about 2 to about 10 percent by weight.

4. The finisher composition of claim 1 wherein the cold water soluble hydrophilic film forming compound is used in the amount from about 4 to about 8 percent by weight.

5. The finisher composition of claim 1 wherein the cold water soluble hydrophilic film forming compound is dextrin derived from the hydrolysis of corn, potato, rice, tapioca or wheat starches.

6. The finisher composition of claim 5 wherein the dextrin is the acid hydrolysis product of waxy maize corn.

7. The finisher composition of claim 1 wherein the hydrophilizing agent is used in the amount of from about 0.01 to about 15 percent by weight.

8. The finisher composition of claim 1 wherein the hydrophilizing agent is used in the amount of from about 0.01 to about 8 percent by weight.

9. The finisher composition of claim 1 wherein the hydrophilizing agent is used in the amount of from about 0.05 to about 2 percent by weight.

10. The finisher composition of claim 1 wherein the hydrophilizing agent is a carboxylated polyacrylamide.

11. The finisher composition of claim 10 wherein the carboxylated polyacrylamide has a molecular weight of from about 10,000 to about 2,000,000.

12. The finisher composition of claim 10 wherein the carboxylated polyacrylamide has a molecular weight of from about 50,000 to about 1,000,000.

13. The finisher composition of claim 10 wherein the carboxylated polyacrylamide has a molecular weight of from about 100,000 to about 500.000.

14. The finisher composition of claim 1 wherein the polyhydric alcohol is polyethylene glycol.

15. The finisher composition of claim 14 wherein the polyethylene glycol has a molecular weight of from about 110 to about 2000.

16. The finisher composition of claim 14 wherein the polyethylene glycol has a molecular weight of from about 150 to about 1000.

17. The finisher composition of claim 14 wherein the polyethylene glycol has a molecular weight of from about 200 to about 400.

18. The finisher composition of claim 1 wherein the polyhydric alcohol is used in an amount of from about 0.01 to about 6 percent by weight.

19. The finisher composition of claim 1 wherein the polyhydric alcohol is used in an amount of from about 0.01 to about 3 percent by weight.

20. The finisher composition of claim 1 wherein the polyhydric alcohol is used in an amount of from about 0.05 to about 1.5 percent by weight.

21. The finisher composition of claim 1 wherein the nonionic surfactant has a hydrophile-lipophile balance of from about 10 to about 20.

22. The finisher composition of claim 1 wherein the nonionic surfactant has a hydrophile-lipophile balance of from about 12 to about 18.

23. The finisher composition of claim 21 wherein the nonionic surfactant is polyoxyethylene tridecyl ether (12 mols of ethylene oxide).

24. The finisher composition of claim 1 wherein the greasing agent has a hydrophile-lipophile balance of from about 8 to about 10.

25. The finisher composition of claim 1 wherein the greasing agent is used in an amount of from about 0.01 to about 1 percent by weight.

26. The finisher composition of claim 1 wherein the greasing agent is used in an amount of from about 0.05 to about 0.5 percent by weight.

27. The finisher composition of claim 25 wherein the greasing agent is the ethoxylate of sorbitan trioleate.

28. The finisher composition of claim 1 wherein the desensitizing salt is used in an amount of from about 0.05 to about 8 percent by weight.

29. The finisher composition of claim 1 wherein the desensitizing salt is used in an amount of from about 0.01 to about 6 percent by weight.

30. The finisher composition of claim 1 wherein the desensitizing salt is used in an amount of from about 1 to about 4 percent by weight.

31. The finisher composition of claim 1 wherein the desensitizing salt is magnesium nitrate.

32. The finisher composition of claim 1 wherein the desensitizing salt is ammonium dihydrogen phosphate.

33. The finisher composition of claim 1 wherein the pH is from about 2 to about 8.

34. The finisher composition of claim 1 wherein the pH is from about 3 to about 6.5.

35. The finisher composition of claim 1 wherein the pH is from about 4 to about 5.5.

* * * * *